(12) United States Patent
Miyoshi et al.

(10) Patent No.: US 10,582,142 B2
(45) Date of Patent: Mar. 3, 2020

(54) PHOTOELECTRIC CONVERSION DEVICE (71) Applicant: Ricoh Company, Ltd., Tokyo (JP)

(72) Inventors: Yuuya Miyoshi, Osaka (JP); Tohru Kanno, Osaka (JP)

(73) Assignee: RICOH COMPANY, LTD., Tokyo (JP)

( * ) Notice: Subject to any disclaimer, the term of this patent is extended or adjusted under 35 U.S.C. 154(b) by 14 days.

(21) Appl. No.: 16/112,032

(22) Filed: Aug. 24, 2018

(65) Prior Publication Data
US 2018/0367749 A1 Dec. 20, 2018

Related U.S. Application Data (63) Continuation of application No. PCT/JP2017/002385, filed on Jan. 24, 2017.

(30) Foreign Application Priority Data

Mar. 10, 2016 (JP) .................................. 2016-047456

(51) Int. Cl.
*H04N 5/3745* (2011.01)
*H04N 5/369* (2011.01)
(Continued)

(52) U.S. Cl.
CPC ....... *H04N 5/37455* (2013.01); *H01L 27/146* (2013.01); *H01L 27/14603* (2013.01);
(Continued)

(58) Field of Classification Search
CPC ........... H04N 5/37455; H04N 5/37452; H04N 5/3658; H04N 5/378; H04N 5/37457;
(Continued)

(56) References Cited

U.S. PATENT DOCUMENTS 5,539,461 A * 7/1996 Andoh ............. H01L 27/14643
250/208.1
9,131,183 B2 9/2015 Miyoshi et al.
(Continued)

FOREIGN PATENT DOCUMENTS

JP 2005-260790 9/2005
JP 2009-130679 6/2009
(Continued)

OTHER PUBLICATIONS

International Search Report dated Apr. 11, 2017 in PCT/JP2017/002385 filed on Jan. 24, 2017.
(Continued)

*Primary Examiner* — Nhan T Tran
(74) *Attorney, Agent, or Firm* — Xsensus LLP (57) ABSTRACT

A photoelectric conversion device, having a horizontally long rectangular shape, includes a pixel block including pixels; signal processing blocks, arranged along a transverse direction of the photoelectric conversion device, for processing a pixel signal; a power source voltage supply block for supplying a power source voltage. The pixel includes a photoelectric conversion element for performing a photoelectric conversion, and a charge/voltage conversion unit, including a first amplifier, for converting the converted charge into a voltage. In the pixel block, columns are arranged in a longitudinal direction. Each column is set as a unit of signal processing including a predetermined number of pixels. Vertical power feeding wirings for feeding the power source voltage to the columns of the pixel block, from the transverse direction, are arranged. Horizontal power feeding wirings for feeding the power source voltage to the pixel block and the signal processing blocks, from the longitudinal direction, are arranged.

8 Claims, 10 Drawing Sheets

(51) Int. Cl.
  *H04N 5/378* (2011.01)
  *H04N 5/365* (2011.01)
  *H01L 27/146* (2006.01)
  *H04N 5/357* (2011.01)
  *H04N 5/374* (2011.01)

(52) U.S. Cl.
  CPC ..... *H01L 27/14645* (2013.01); *H04N 5/3577* (2013.01); *H04N 5/3658* (2013.01); *H04N 5/3698* (2013.01); *H04N 5/378* (2013.01); *H04N 5/3741* (2013.01); *H04N 5/37452* (2013.01); *H04N 5/37457* (2013.01)

(58) Field of Classification Search
  CPC .. H04N 5/3741; H04N 5/3577; H04N 5/3698; H01L 27/146; H01L 27/14645; H01L 27/14603
  See application file for complete search history.

(56) References Cited

U.S. PATENT DOCUMENTS

| | | | |
|---|---|---|---|
| 9,781,278 B2 | 10/2017 | Miyoshi et al. | |
| 2005/0264665 A1* | 12/2005 | Endo | H04N 5/32 |
| | | | 348/308 |
| 2006/0180742 A1* | 8/2006 | Kwon | H04N 5/365 |
| | | | 250/208.1 |
| 2009/0166547 A1 | 7/2009 | Endo et al. | |
| 2010/0097486 A1* | 4/2010 | Iwane | H01L 27/14603 |
| | | | 348/222.1 |
| 2015/0062393 A1 | 3/2015 | Komaba | |
| 2016/0358958 A1 | 12/2016 | Miyoshi et al. | |
| 2019/0260954 A1* | 8/2019 | Tamaki | H04N 5/2253 |

FOREIGN PATENT DOCUMENTS

| | | |
|---|---|---|
| JP | 2009-200546 | 9/2009 |
| JP | 2012-065106 | 3/2012 |
| JP | 2015-128221 | 7/2015 |
| JP | 2017-005427 | 1/2017 |
| JP | 2017-147663 | 8/2017 |
| WO | 2013/099266 A1 | 7/2013 |

OTHER PUBLICATIONS

Written Opinion dated Apr. 11, 2017 in PCT/JP2017/002385 filed on Jan. 24, 2017.
Extended European Search Report dated Dec. 3, 2018 in Patent Application No. 17762734.6.

* cited by examiner

PHOTOELECTRIC CONVERSION DEVICE

CROSS-REFERENCE TO RELATED APPLICATION

The present application is a continuation application filed under 35 U.S.C. 111(a) claiming benefit under 35 U.S.C. 120 and 365(c) of PCT International Application No. PCT/JP2017/002385 filed on Jan. 24, 2017 and designating the U.S., which claims priority of Japanese Patent Application No. 2016-047456 filed on Mar. 10, 2016. The entire contents of the foregoing applications are incorporated herein by reference.

BACKGROUND OF THE INVENTION

1. Field of the Invention

The disclosure herein generally relates to a photoelectric conversion device.

2. Description of the Related Art

A photoelectric conversion device is configured of a pixel block, in which pixels, each provided with an photoelectric conversion element for performing a photoelectric conversion in accordance with an incident light, and an electric charge voltage conversion unit for converting electric charges subjected to the photoelectric conversion into an electric voltage, are arranged in two-dimensions; and a plurality of signal processing units for processing signals output from the pixel block. Such a configuration is formed by a CMOS (Complementary Metal Oxide Semiconductor) that is advantageous for integrating.

Such photoelectric conversion devices have been applied, as imaging elements (image sensors), to various imaging apparatuses, such as video cameras, digital cameras, or copying machines. In the image sensors installed in imaging apparatuses, noise is desired to be reduced in order to achieve high imaging qualities. However, a layout area on a substrate for arranging the imaging sensor is restricted.

For example, Japanese Unexamined Patent Application Publication No. 2009-200546 discloses a configuration, in which horizontal transfer bus lines intersect each other above a column AD circuit, the layout area is prevented from increasing, and an occurrence of noise due to crosstalk from the column AD circuit to the horizontal transfer bus lines is reduced.

SUMMARY OF THE INVENTION

Problem Solved by the Invention

In a case of performing a power feeding only by a horizontal power feeding for a horizontally long photoelectric conversion device, as in Japanese Unexamined Patent Application Publication No. 2009-200546, as measures against an IR drop, a power source/ground region is required, and a power feeding with a wide wiring conductor (metal) becomes necessary. That is, arising from an increase in a size of the photoelectric conversion device in the transverse direction, and from a decrease in a number of obtained chips per one wafer, a manufacturing cost for one chip increases.

Thus, the present invention, in view of the aforementioned problem, aims at providing a photoelectric conversion device in which a size in the transverse direction can be reduced.

Means for Solving the Problem

In order to solve the aforementioned problem, according to an aspect of the present invention, a photoelectric conversion device, having a horizontally long rectangular shape, including a pixel block in which a plurality of pixels are arranged;

a plurality of signal processing blocks, arranged in parallel along a transverse direction of the photoelectric conversion device, configured to process a signal output from the pixel block;

a power source voltage supply block configured to supply a power source voltage to the pixel block and the plurality of signal processing blocks; and an electrode pad connected to the power source voltage supply block, each of the plurality of pixels including a photoelectric conversion element configured to perform a photoelectric conversion in accordance with an incident light, and an electric charge/voltage conversion unit, including a first amplifier, configured to convert an electric charge, converted from the incident light, into an electric voltage, in the pixel block, a plurality of columns being arranged in parallel along a longitudinal direction of the photoelectric conversion device, each column being set as a unit of signal processing including a predetermined number of pixels, as a whole entity, a plurality of vertical power feeding wirings that enable the power source voltage, output from the power source voltage supply block, to be fed to each of the plurality of columns of the pixel block, from the transverse direction, being arranged, a plurality of horizontal power feeding wirings that enable the power source voltage, output from the power source voltage supply block, to be fed to the pixel block and the plurality of signal processing blocks, from the longitudinal direction, being arranged, and the plurality of vertical power feeding wirings and the plurality of horizontal power feeding wirings being connected to each other, is provided.

Advantageous Effect of Invention

According to an aspect of the present invention, in the photoelectric conversion device, a size in a transverse direction can be reduced.

BRIEF DESCRIPTION OF THE DRAWINGS

Other objects and further features of embodiments will become apparent from the following detailed description when read in conjunction with the accompanying drawings, in which.

DETAILED DESCRIPTION OF THE PREFERRED EMBODIMENTS

In the following, with reference to the accompanying drawings, embodiments of the present invention will be described. In the specification and the drawings, the same reference numeral is assigned to members having substantially the same function configuration, and a duplicate explanation may be omitted.

First Embodiment

Figure 1:
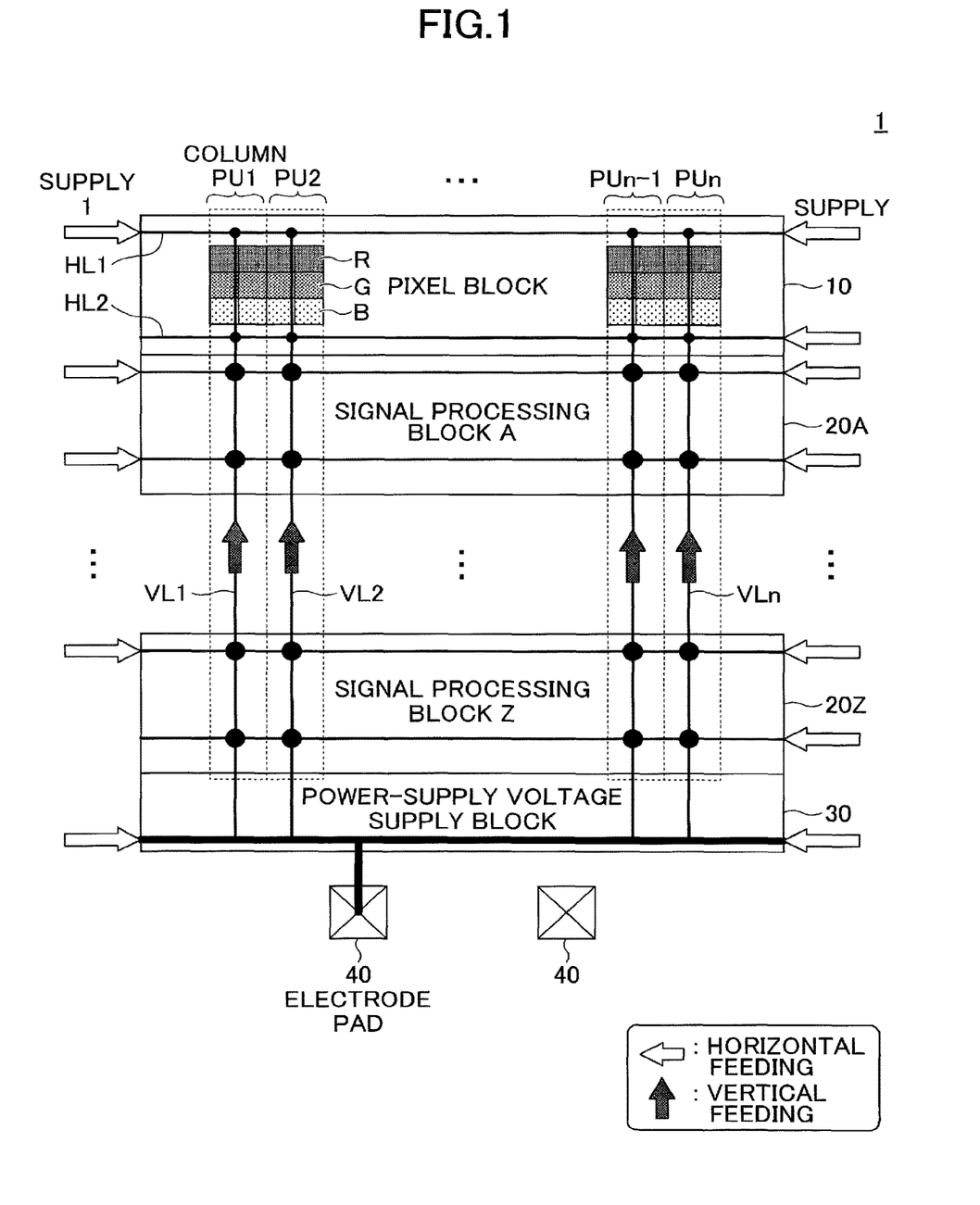
FIG. 1 is a diagram depicting a photoelectric conversion device according to a first embodiment of the present invention.

FIG. 1 is a diagram depicting a photoelectric conversion device according to a first embodiment of the present invention. The photoelectric conversion devices according to the present invention function as CMOS sensors that are used in various imaging apparatuses such as video cameras, digital cameras, or copying machines.

The photoelectric conversion device 1, illustrated in FIG. 1, includes a pixel block 10, signal processing blocks 20A to 20Z, a power source voltage supply block 30, and an electrode pad 40.

In the pixel block 10, pixels that convert light amounts of incident light into pixel signals are arranged in two dimensions.

The signal processing blocks 20A to 20Z perform processing for a signal output from the pixel block 10. The plurality of signal processing blocks 20A to 20Z are arrayed (arranged in parallel) in a transverse direction of the photoelectric conversion device 1.

The power source voltage supply block 30 supplies a power source voltage to the respective blocks, as described above. The electrode pad feeds a power source voltage to the power source voltage supply block 30.

Moreover, the photoelectric conversion device, to which the present invention is applied, has a horizontally long rectangular shape with a pair of longer sides and a pair of shorter sides. In the photoelectric conversion device 1, the pixel block 10, the signal processing blocks 20A to 20Z, the power source voltage supply block 30, and the electrode pad 40 are arrayed in this order from the top to the bottom in the shorter side direction (in the vertical direction in FIG. 1).

A plurality of vertical power feeding wirings VL1 to VLn that make the power source voltage, output from the power source voltage supply block 30, possible to be fed to each of the plurality of columns (PU1 to PUn) of the pixel block 10, in the shorter side direction of the photoelectric conversion device 1 (transverse direction, vertical direction in FIG. 1), are arranged.

In the specification, a column means a smallest unit of a signal processing system, in which a plurality of photoelectric conversion elements are collected as a whole (a signal processing unit as a whole). In the present application, a system of processing six photoelectric conversion elements (two pixels for R (red), G (green) and B (blue), respectively) is defined as one column. Note that the number of pixels for one column is not limited to 6, and may be other numbers.

In the pixel block 10, a plurality of columns PU1 to PUn, each having the signal processing unit, set as above, are arrayed (arranged in parallel) in the longer side direction of the photoelectric conversion device 1 (in the horizontal direction in FIG. 1).

A plurality of horizontal power feeding wirings HL that make the power source voltage, output from the power source voltage supply block 30, possible to be fed to the pixel block 10 and the plurality of signal processing blocks 20A to 20Z, in the longer side direction of the photoelectric conversion device 1 (longitudinal direction), are arranged.

Then, the vertical power feeding wirings VL, which transfer power source voltage from the power source voltage supply block 30 and extend in the transverse direction, and the horizontal power feeding wirings HL, that extend in the longitudinal direction, are connected to each other.

In the specification, the horizontal power feeding means a power feeding in the longitudinal direction (horizontal direction in FIG. 1) of the photoelectric conversion device (power feeding to each block from the longitudinal direction), and the vertical power feeding means a power feeding in the transverse direction (vertical direction in FIG. 1) of the photoelectric conversion device (power feeding to each block from the transverse direction).

In the first embodiment of the present invention, illustrated in FIG. 1, in all wirings having a meshed shape, both the vertical power feeding and the horizontal power feeding are performed.

Comparative Example

Figure 2:
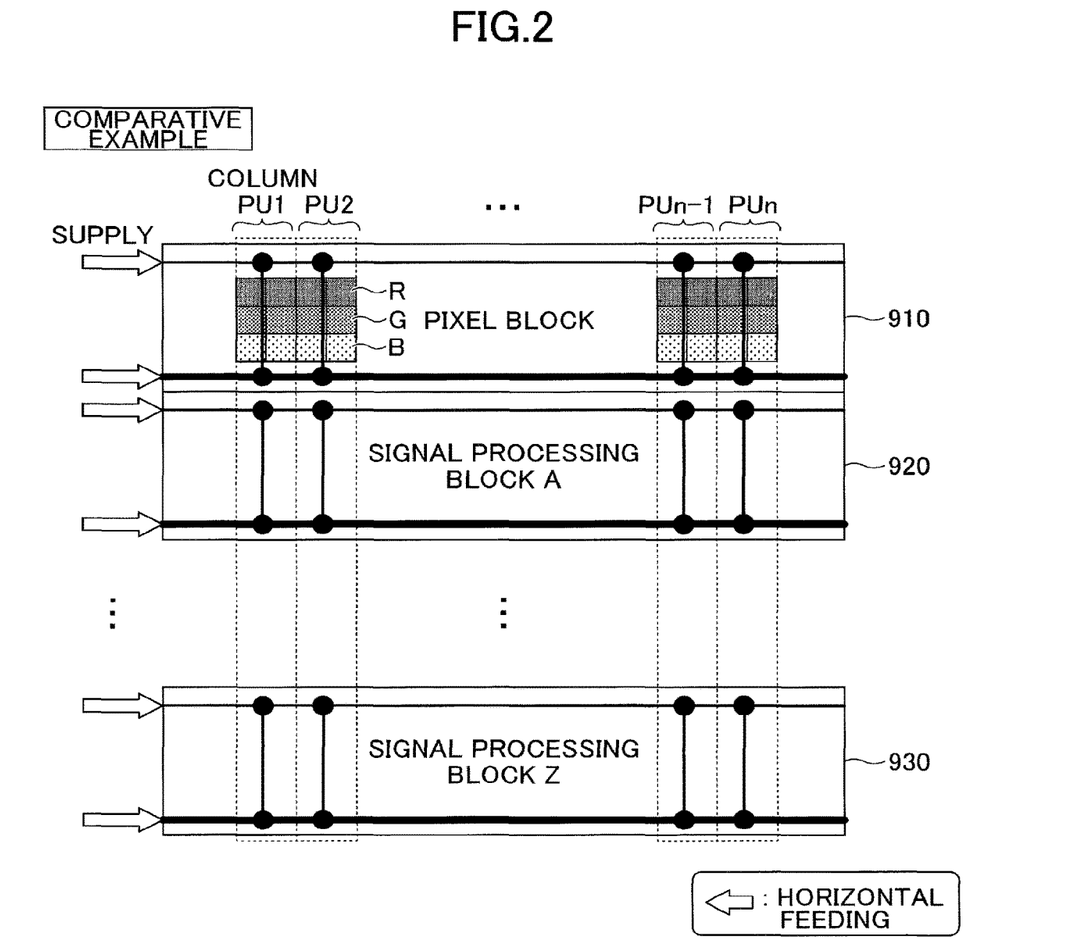
FIG. 2 is a diagram depicting a photoelectric conversion device according to a comparative example.

FIG. 2 is a diagram depicting a photoelectric conversion device according to a comparative example. In the comparative example, in the horizontally long photoelectric conversion device, power feeding is performed only by the horizontal power feeding.

The size in the longitudinal direction of the photoelectric conversion device is determined by a number of installations of the photoelectric conversion elements and a size of one photoelectric conversion element. In more detail, in order to reduce the size in the longitudinal direction, the number of installations of the photoelectric conversion elements required to be reduced, or the size of one photoelectric conversion element is required to be reduced.

However, when the number of installations of the photoelectric conversion elements is reduced, a resolution may degrade. When the size of the photoelectric conversion element is reduced, sensitivity is reduced. Thus, the reduction of the size in the longitudinal direction of the photoelectric conversion device is difficult.

Thus, in order to reduce an area of the photoelectric conversion device, the size in the transverse direction is required to be reduced. For example, an entire size is reduced without changing the size in the longitudinal direction, and an aspect ratio of "longitudinal direction:transverse direction" becomes 10:1 and sometimes reaches 100:1.

As illustrated in FIG. 2, when the power feeding is performed only by the horizontal power feeding for the photoelectric conversion device, an IR drop that is a voltage drop of an IR product occurring on a power source wiring occurs.

Thus, taking into account the IR drop, a power feeding with a wide (the size of the photoelectric conversion device in the transverse direction is great) wiring conductor (wiring metal) is required. For example, in a case where a target resistance value taking into account the IR drop is A (Ω), a sheet resistance value is C (Ω/□) (ohm per square), and the length of the photoelectric conversion device in the longitudinal direction is D μm, a required metal width B μm is $$B(\mu m) > D(\mu m) \times C(\Omega/\square)/A(\mu m),$$

and the required wiring metal width B is proportional to the length of the photoelectric conversion device in the longitudinal direction.

In other words, in the configuration of the comparative example, illustrated in FIG. 2, when the length in the longitudinal direction increases, the width of the wiring metal is required to be widened, and the length of the photoelectric conversion device in the transverse direction is increased.

Thus, in order to reduce the length in the transverse direction, in the present invention as illustrated in FIG. 1, a configuration, in which the vertical power feeding is used in combination with the horizontal power feeding, is employed. In more detail, the power source voltage supplying block 30 and electrode pad 40 are arranged below the signal processing blocks 20A to 20Z, and a vertical feeding power is performed for each column for the pixel block 10 and the plurality of signal processing blocks 20A to 20Z from the power source voltage supplying block 30 and the electrode pad 40, and thereby the vertical power feeding is used in combination with the horizontal power feeding.

In the above-described configuration, even if the wiring resistance of each vertical power feeding wiring VL is F (Ω), when a number of columns is E, a combined resistance is F/E, and thus the resistance value can be reduced according to the number of columns. In FIG. 1, because the vertical power feeding, by which the combined resistance can be decreased relatively easily, is applied jointly, a resistance value for the horizontal power feeding can be increased. That is, the width of the power feeding wiring of the horizontal power feeding wiring HL can be decreased, and the size of the photoelectric conversion device in the transverse direction can be reduced. Thus, the number of obtained chips per one wafer increases, and a manufacturing cost can be decreased.

<Pixel Block>

Figure 3:
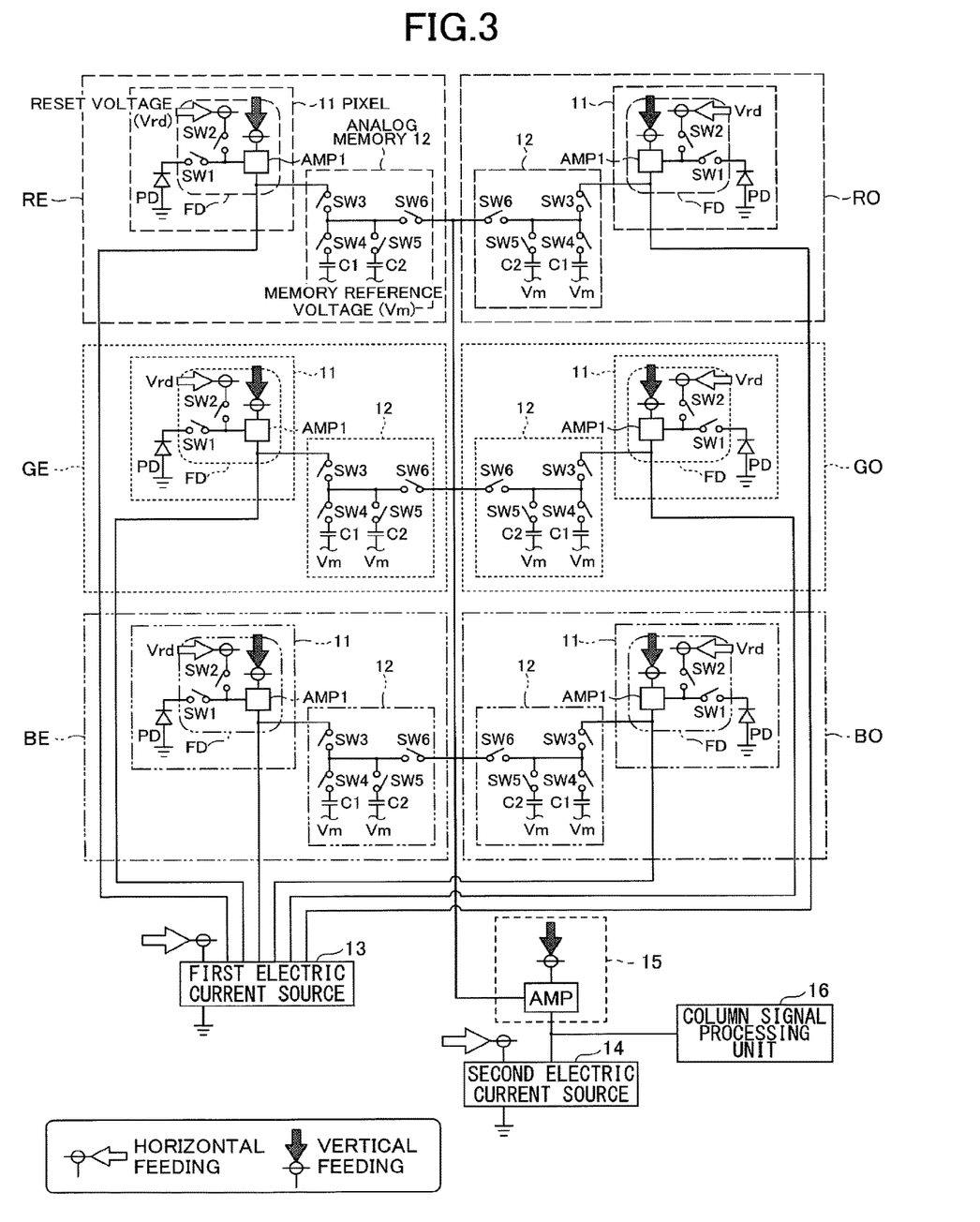
FIG. 3 is a diagram depicting a detailed configuration in a pixel block in the photoelectric conversion device illustrated in FIG. 1.

In the following, a configuration of a column in a pixel block will be described. FIG. 3 is a diagram depicting, in detail, a configuration in the pixel block 10 of the photoelectric conversion device, illustrated in FIG. 1.

In FIG. 3, six pixel units RE, RO, GE, GO, BE, and BO, each configured of a pixel 11 and an analog memory, will be described as one column PUx. However, the number of columns that is a processing unit is not limited to this number. Note that RE and RO indicate two pixel units in which color filters transmitting red light (R) are arranged on light receiving elements. Moreover, GE and GO indicate two pixel units in which color filters transmitting green light (G) are arranged. Furthermore, BE and BO indicate two pixel units in which color filters transmitting blue light (B) are arranged.

Each of the pixel units RE, RO, GE, GO, BE and BO is provided with the pixel 11 and the analog memory 12. In the following, using the pixel unit RO, a configuration inside the pixel unit will be described. But the other pixel units are assumed to have the same configuration.

A pixel (pixel circuit) is an active pixel sensor that performs an electric charge-electric voltage conversion and amplification inside the circuit. The pixel 11 is provided with a photoelectric conversion element PD, a float diffusion region FD, or the like. A photoelectric conversion element (light receiving element) PD accumulates electric charges generated by an incidence of light. The float diffusion region FD functions as an electric charge/voltage conversion unit that, when charges are read, transfers the charges to a junction floating capacitance in the pixel 11, and performs the electric charge-electric voltage conversion.

In the pixel 11, an anode of photoelectric conversion element PD is connected to a ground voltage, and a cathode of the photoelectric conversion element PD is connected to an end of a transfer switch SW1. The other end of the transfer switch SW1 is connected to a first amplifier AMP1, and a reset switch SW2.

Note that a region, in which the transfer switch SW1, the first amplifier AMP1 and the reset switch SW2 and the reset switch SW2 are connected to each other, is referred to as a float diffusion region FD. One end of the first amplifier AMP1 is connected to an electric current source 13.

To the other end of the reset switch, which is not connected to the transfer switch SW1 and the first amplifier AMP1, a drive signal Vrd that is a reset voltage is applied.

In an upper part of the photoelectric conversion element PD, a color filter or a micro lens (not shown) is formed. The aforementioned members, i.e. the transfer switch SW1, the reset switch SW1, the photoelectric conversion element PD, the first amplifier AMP1, the color filter and the micro lens, are referred to as a pixel, as a whole. Note that the micro lens is not required to be formed.

By arranging the analog memory 12, a signal can be stored temporarily, and R/G/B signal levels and reset levels, stored in the analog memory, can be read out in a desired order (e.g. reset level of R->signal levels->reset level of G-> . . . ).

The members illustrated in FIG. 3, i.e. a pixel selection switch SW6, capacitance selection switches SW4 and SW5, capacitors C1 and C2, and a memory writing selection switch SW3, are referred to as an analog memory, as a whole.

In the analog memory 12, the capacitance selection switches SW4 and SW5 are connected to one ends of the capacitors C1 and C2, respectively. The other ends of the capacitors C1 and C2 are connected to a predetermined memory reference voltage Vm.

An end of the first amplifier AMP1 in the pixel 11 is connected to the first electric current source 13, and to the selection switches SW4 and SW5 for selecting the capacitors C1 and C2, and the pixel selection switch SW6 for selecting a pixel, via the memory writing selection switch SW3.

The pixel selection switch SW6 in each of the plurality of analog memories 12 (six memories in the drawing) is connected to a second amplifier 15 and a second electric current source 14. Moreover, to the second amplifier 15, a column signal processing unit 16 is connected.

In the case of using the same chip in a variety of products, in a product an image characteristic may be prioritized and in another product a consumption current may be prioritized.

Thus, a system, in which an electric current to the first amplifier AMP1 or the second amplifier 15 is variable, will be preferable.

In FIG. 3, for a power source for the first amplifier AMP1 and a power source for the second amplifier 15, the vertical power feeding (e.g. power feeding 2, illustrated in FIG. 5) will be used.

On the other hand, the reset voltage Vrd, which is applied to the reset switch SW2 in each pixel 11, for the first electric current source 13, and for the second electric current source 14, the horizontal power feeding (power feeding 1, illustrated in FIG. 5) will be used.

Figure 5:
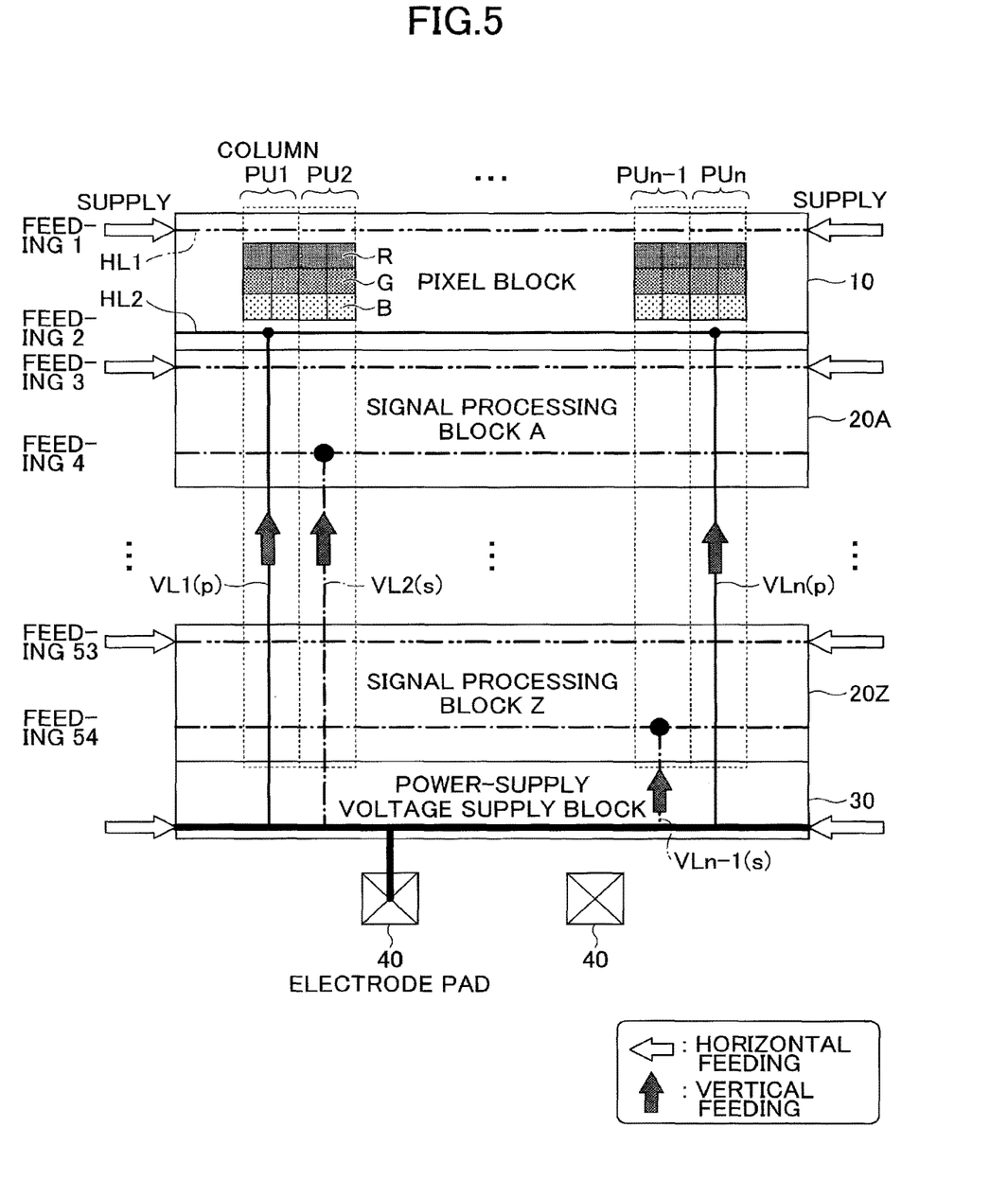
FIG. 5 is a diagram depicting a photoelectric conversion device according to a second embodiment of the present invention.

The memory reference voltage Vm that is connected to the capacitors C1 and C2 in the analog memory 12 may be generated by being drawn from the ground terminal, or may be generated by using the horizontal power feeding (power feeding 1, illustrated in FIG. 5).

In this way, also in one column, by employing the configuration, in which the vertical power feeding and the horizontal power feeding are combined, a wiring width of the horizontal power feeding wiring HL can be reduced, and the size of the photoelectric conversion device in the transverse direction can be decreased. Thus, the number of obtained chips per one wafer increases, and a manufacturing cost can be decreased.

<Details of Pixel Block>

Figure 4:
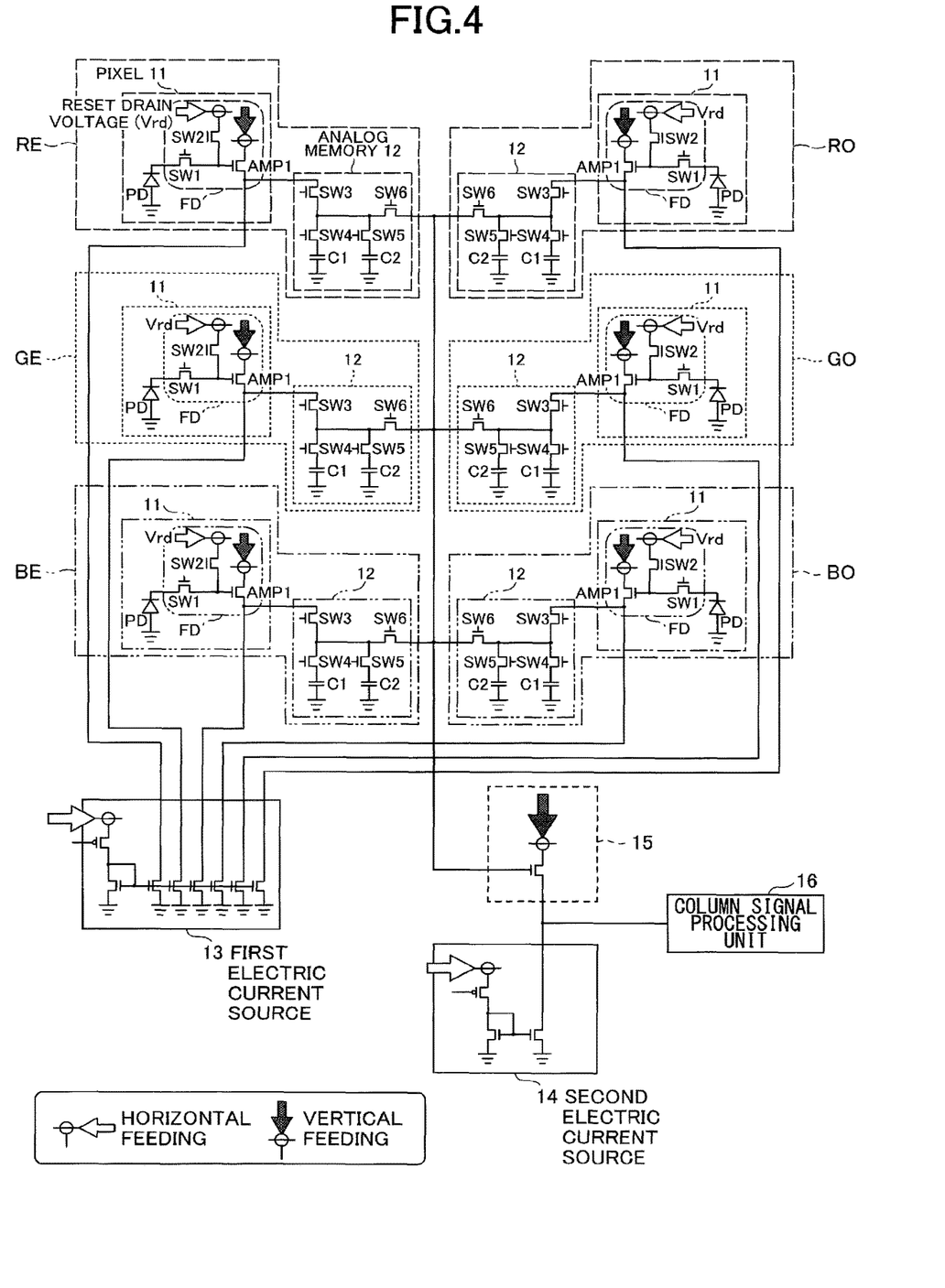
FIG. 4 is a diagram depicting a circuit in a case where a switch or an amplifier is configured of a transistor in the pixel block illustrated in FIG. 3.

FIG. 4 is a diagram depicting a circuit in which the switches and the amplifiers illustrated in FIG. 3 are configured with transistors.

In the configuration, illustrated in FIG. 4, each of the switches SW1 to SW6 is configured with one transistor (Tr). Note that as a circuit for realizing the configuration illustrated in FIG. 3, a CMOS-switch using an Nch type transistor or a Pch type transistor taking into account an ON resistance of a transistor and a charge injection may be employed. Moreover, depending on the electric voltage, the switch may be configured with a Pch-type transistor. For example, when the reset voltage Vrd is high, an electric voltage of the memory writing selection transistor SW3 also becomes high, and the ON resistance can be made lower by using the Pch type switch rather than using an Nch type switch.

In the analog memory 12, for the capacitances of the capacitors C1 and C2, taking into account area efficiencies, a MOS capacitance is preferably used. In particular, an electric voltage that is applied to the capacitance selection switches SW4 and SW5 sides of the capacitors C1 and C2 is a level, that is closer to the electric voltage on the power source voltage side of the analog memory 12 than the electric voltage on the ground side of the analog memory 12. Thus, for the capacitors C1 and C2, Nch type MOS transistors (MOS capacitance) are preferably used.

Because a potential difference between both ends of the MOS capacitance is not always great enough to maintain an oxide film capacitance, a depression type MOS capacitance is preferably used.

A memory reference voltage Vm at one end of each of the capacitors C1 and C2 may be in common with the ground voltage of the other circuits. However, when the memory reference voltage Vm fluctuates, depending on its timing, the fluctuation of the reference voltage appears directly in the output. Thus, the memory reference voltage Vm is preferably separated from the ground voltage of the other circuits.

FIG. 4 is a diagram depicting an example of a second amplifier 15 that is configured of one Nch type MOS transistor. Note that a back gate of a transistor 15 configuring the second amplifier (referred to as a second amplifier transistor) is preferably connected to a source, taking into account a back gate effect. However, the back gate effect is a trade off with an area of the transistor, and the source is not required to be connected to the back gate. In the embodiment, an Nch type MOS transistor has been described, but the second amplifier may be configured of a Pch type transistor.

In a case of using the same chip in a variety of products, an image characteristic is prioritized in one product, and a consumption current is prioritized in another product. Thus, a current flowing in a transistor AMP1 configuring the first amplifying unit (referred to as a first amplifier transistor) or in a second amplifier transistor 15, is preferably variable.

In each pixel 11, when the size of the first amplifier transistor AMP1 is made excessively large, a capacitance parasitic in the FD region becomes large, and an electric charge/electric voltage conversion gain degrades (according to the relation V=Q/C), the first amplifier transistor AMP1 cannot be made large.

In contrast, the size of the second amplifier transistor 15 that is common in a column does not so much affect the conversion gain as the first amplifier transistor AMP1. Thus, taking into account noise characteristics (flicker noise, thermal noise, RTS noise or the like), the size of the second amplifier transistor 15 is preferably as large as possible. Moreover, the size of the second amplifier transistor 15 affects little an entire size of the chip. Thus, the size of the second amplifier transistor 15 is preferably greater than the first amplifier transistor AMP1.

Moreover, the first electric current source 13 and the second electric current source 14 are configured of a plurality of transistors.

In FIG. 4, for the power source for the first amplifier transistor AMP1 and for the power source for the second amplifier transistor 15, the vertical power feeding (power feeding 2) is used (See FIG. 5).

In contrast, for the reset voltage Vrd applied to the reset transistor SW2 in each pixel 11, for the first electric current source 13 and for the second electric current source 14, the horizontal power feeding (power feeding 1) is used.

In this way, by using the vertical power feeding and the horizontal power feeding differently depending on the intended use, noise associated with the wiring can be controlled.

Second Embodiment

FIG. 5 is a diagram depicting an example of a photoelectric conversion device according to a second embodiment of the present invention.

In the embodiment, the vertical power feeding is performed from the power source voltage supply block 30, for each column, to different blocks (alternately to the pixel block 10 and the plurality of signal processing blocks 20A to 20Z). That is, the pixel block 10 and each of the plurality of signal processing blocks 20A to 20Z are fed power via the different vertical power feeding wiring VL for each column.

For example, to the pixel block 10, the power source voltage is supplied via a vertical power feeding wiring VL1 (VL1(p)) (vertical power feeding wiring for pixel block) corresponding to a predetermined column (e.g. a column PU1, Pn). Additionally, to the signal processing blocks 20A to 20Z, the power source voltage is supplied via a vertical power feeding wiring VL2 (VL2(s)) (vertical power feeding wiring for signal processing unit blocks) corresponding to a column different from the predetermined column (PU1).

That is, in the plurality of vertical power feedings VL1 to VLn, vertical power feedings to be fed to the pixel block 10 (VLx(p) (e.g. VL1(p), VLn(p))) and vertical power feedings to be fed to the plurality of signal processing blocks 20A to 20Z, respectively, (VLx(s) (e.g. VL2(s), VLn−1(s))) are preliminarily separated. Thus, the pixel block 10 and the plurality of signal processing blocks 20A to 20Z are fed power via different vertical power feeding wirings VLx(p) and VLx(s), for each column.

In the photoelectric conversion device according to the embodiment, configured as above, the pixel block 10 and the signal processing blocks 20A to 20Z do not share the vertical power feedings and the horizontal power feedings in a mesh-shaped pattern, as illustrated in FIG. 1, but the vertical power feeding and the horizontal power feeding are performed independently via separated wirings. Thus, noise is not mutually affected, and interference of noise when the power feeding is performed can be further reduced, compared with the first embodiment.

For example, in the case where the signal processing block 20A is a noise source, when the block 20A and the pixel block 10 share a power source, the noise may appear as a fluctuation of the power supplied to the pixel block 10.

Suppose that in a vertical power feeding wiring VL, a wiring resistance between the pixel block 10 and the power source voltage supply block 30 is 200Ω, a wiring resistance between the signal processing block 20A and the power source voltage supply block 30 is 150Ω, and a wiring resistance between the signal processing block 20A and the pixel block 10 is 50Ω, a wiring resistance of a path in which noise propagates, in the configuration illustrated in FIG. 1, would be 50Ω.

In contrast, as described in the embodiment, when a block to be subjected to the vertical power feeding is changed by column, the wiring resistance of the path, in which noise propagates, is 350Ω. The resistance value becomes 350/50 times=7 times the original resistance, and a cut-off frequency becomes 1/7 times the original frequency, and the noise is reduced to 1/7 times the original noise.

In this way, the power is supplied in the wirings, such that noise and a pixel block are independent from each other, and thereby the image quality can be further enhanced.

Furthermore, in order to avoid a fluctuation in an electric voltage from a direct current power source when a circuit operates, a bypass capacitor for connecting the power source line and the ground (terminal) may be arranged in the power source voltage supply block 30.

In this way, by arranging the bypass capacitor, noise occurring between blocks can be further reduced.

Next, a specific example of a configuration for controlling noise will be described.

For the case of using the photoelectric conversion device for a photoelectric detection as a CMOS sensor, or the like, the photoelectric conversion device is designed so that noise for a power source, in the signal processing block 20A to 20Z, is equivalent to 1 LSB (least significant bit) or less, on a 10 bits output conversion basis.

When the noise of 1 LSB enters the pixel block 10 via the shared power source, the noise may directly appear as noise of 1 LSB in an output of the pixel block. Typically, because a signal output from the pixel block 10 is amplified with a gain of about 10 times, the original noise that is 1 LSB becomes 10 LSB.

That is, taking into account an amount amplified with the gain, the wiring resistance is set so that the noise is less than 1/10 of the designed value, i.e. the cut-off frequency is less than 1/10 of the designed value for the frequency. Specifically, when the wiring resistance from the pixel block 10 to the power source voltage supply block 30 is Y (Ω), the wiring resistance from the signal processing blocks 20A to 20Z to the power source voltage supply block 30 is Z (Ω), and the wiring resistances satisfy the relation "Z+Y>10*(Y−Z)", an affect from the noise to an image becomes small. Specifically, it is found that when the wiring resistances are set as above, the noise in the output from the pixel block 10 becomes noise that is 1 LSB or less on the 10 bits conversion basis, and little affects an image.

Furthermore, more preferably, when the noise is reduced to 1/100 (when the cut-off frequency is reduced to 1/100), the noise in the output from the pixel block 10 becomes 0.1 LSB on the 10 bits output conversion basis, and does not affect an image. That is, the wiring resistances are required to satisfy the relation Z+Y>100*(Y−Z). With this setting, the noise becomes noise of 0.1 LSB or less on the 10 bits conversion basis, and does not appreciably affect an image.

Third to fifth embodiment, as follows, will be described by applying the method of performing the vertical power feeding to a different block for each column, used in the second embodiment, to a photoelectric conversion device.

Third Embodiment

Figure 6:
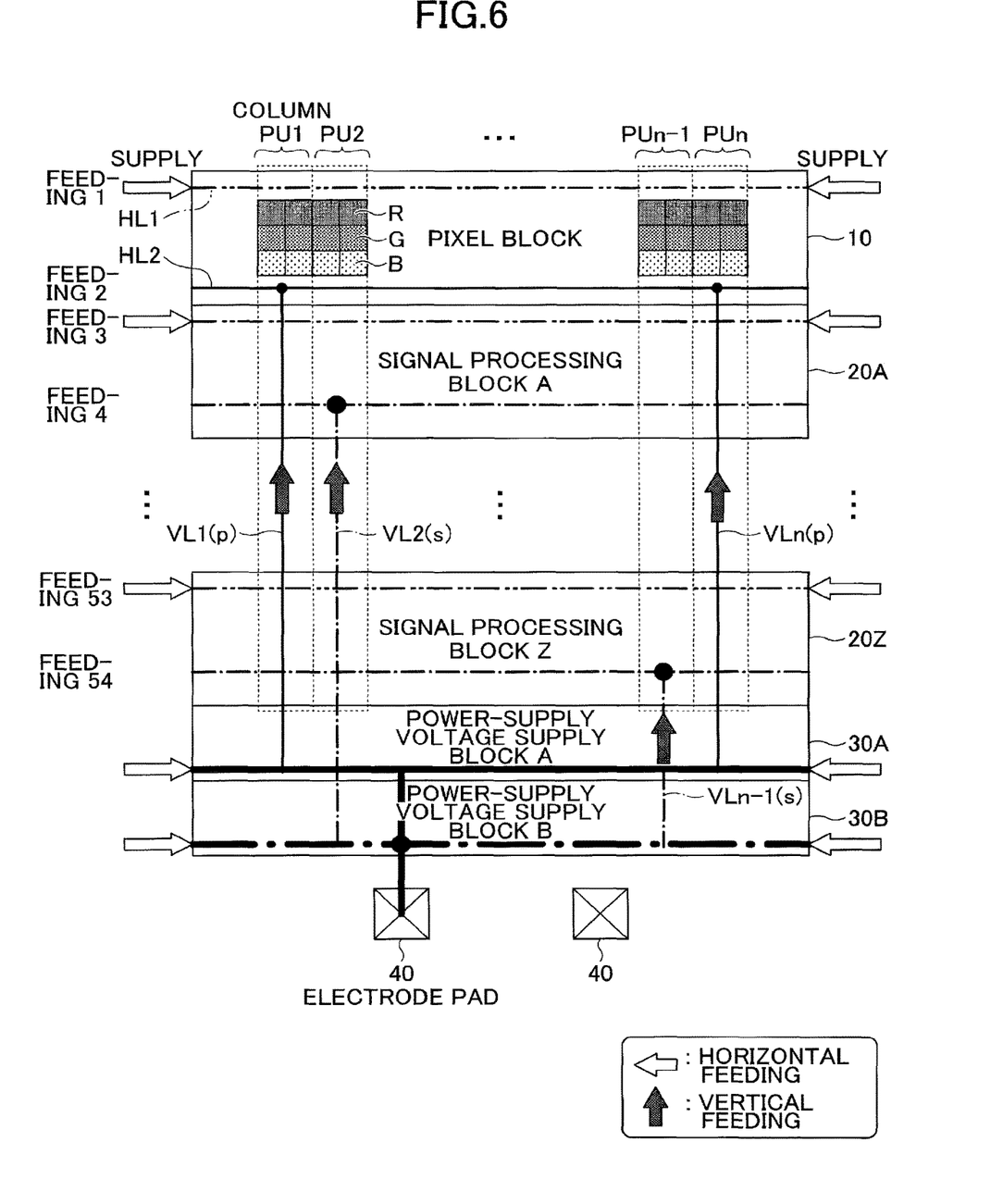
FIG. 6 is a diagram depicting the photoelectric conversion device in which a plurality of power source voltage supply blocks are arranged.

FIG. 6 is a diagram depicting an example of a photoelectric conversion device in a case where a plurality of power source voltage supply blocks 30A and 30B are provided. As illustrated in FIG. 6, the power source voltage supply block 30 is not necessarily limited to a single block.

In this way, when two or more power source supply blocks are provided, for respective types of the blocks to be fed power, i.e. for the pixel block 10 and the signal processing blocks 20 (20A to 20Z), respectively, the power source supply blocks 30A and 30B that are power feeding sources corresponding to the respective blocks can be separated. Thus, the photoelectric conversion device is not affected by a difference in the power source voltage values, and noise can be prevented from entering the output from the pixel block 10 when the power feeding is performed.

Fourth Embodiment

Figure 7:
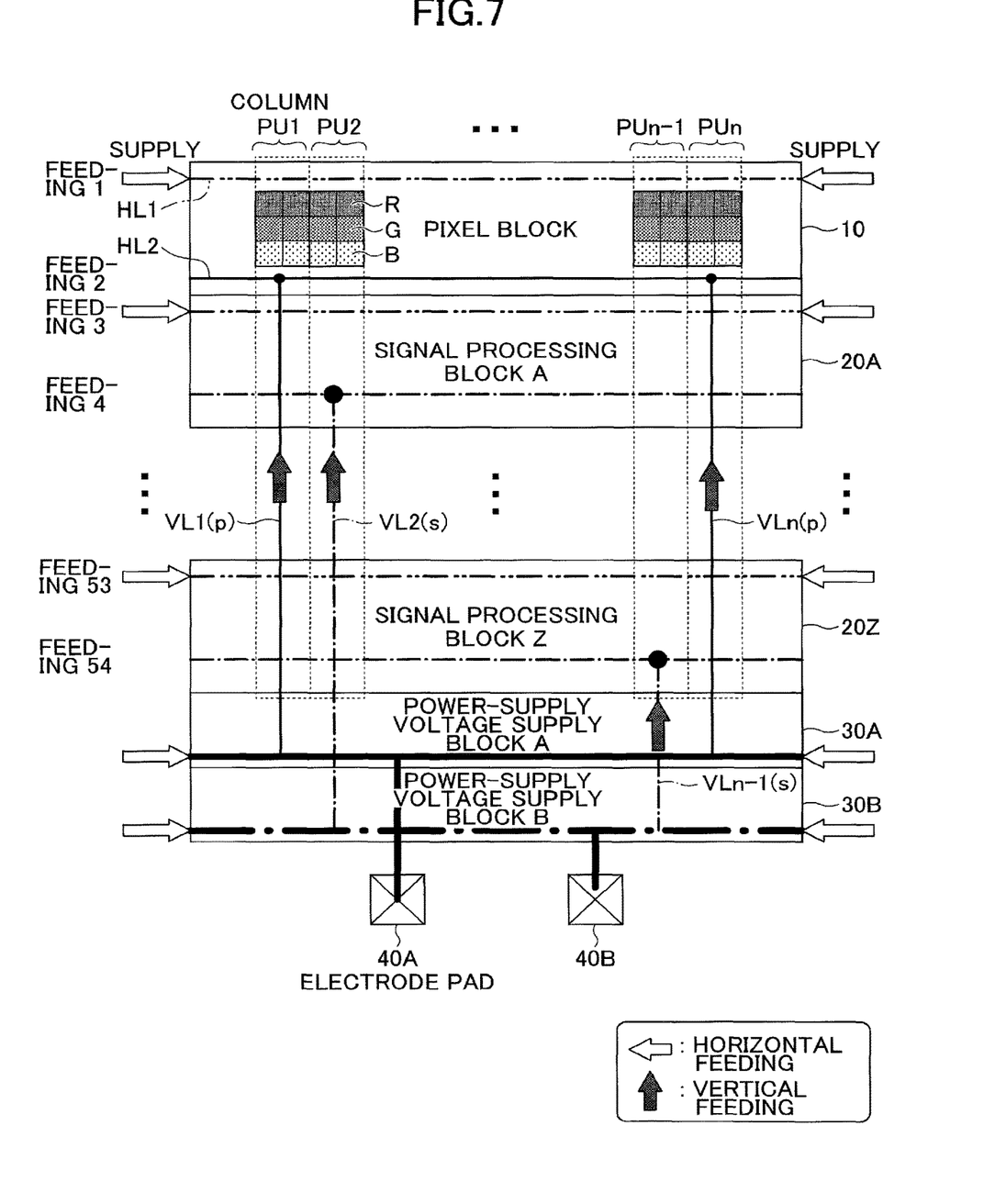
FIG. 7. is a diagram depicting the photoelectric conversion device in which a plurality of electrode pads are arranged.

FIG. 7 is a diagram depicting an example of a photoelectric conversion device in a case where a plurality of electrode pads 40 are provided. As illustrated in FIG. 7, the electrode pad 40 and the power source voltage supply block 30 are not necessarily limited to a single pad and a single block, respectively.

Furthermore, when the two or more electrode pads are arranged and power source is supplied to the respective electrode pads, for respective types of the blocks to be fed power, i.e. for the pixel block 10 and the signal processing blocks 20 (20A to 20Z), respectively, the power source supply blocks 30A and 30B that are power feeding sources for feeding power and the electrode pads 40A and 40B can be separated. Thus, the photoelectric conversion device is not affected by a difference in the power source voltage values, and noise can be prevented from entering the output from the pixel block 10 when the power feeding is performed.

Fifth Embodiment

Figure 8:
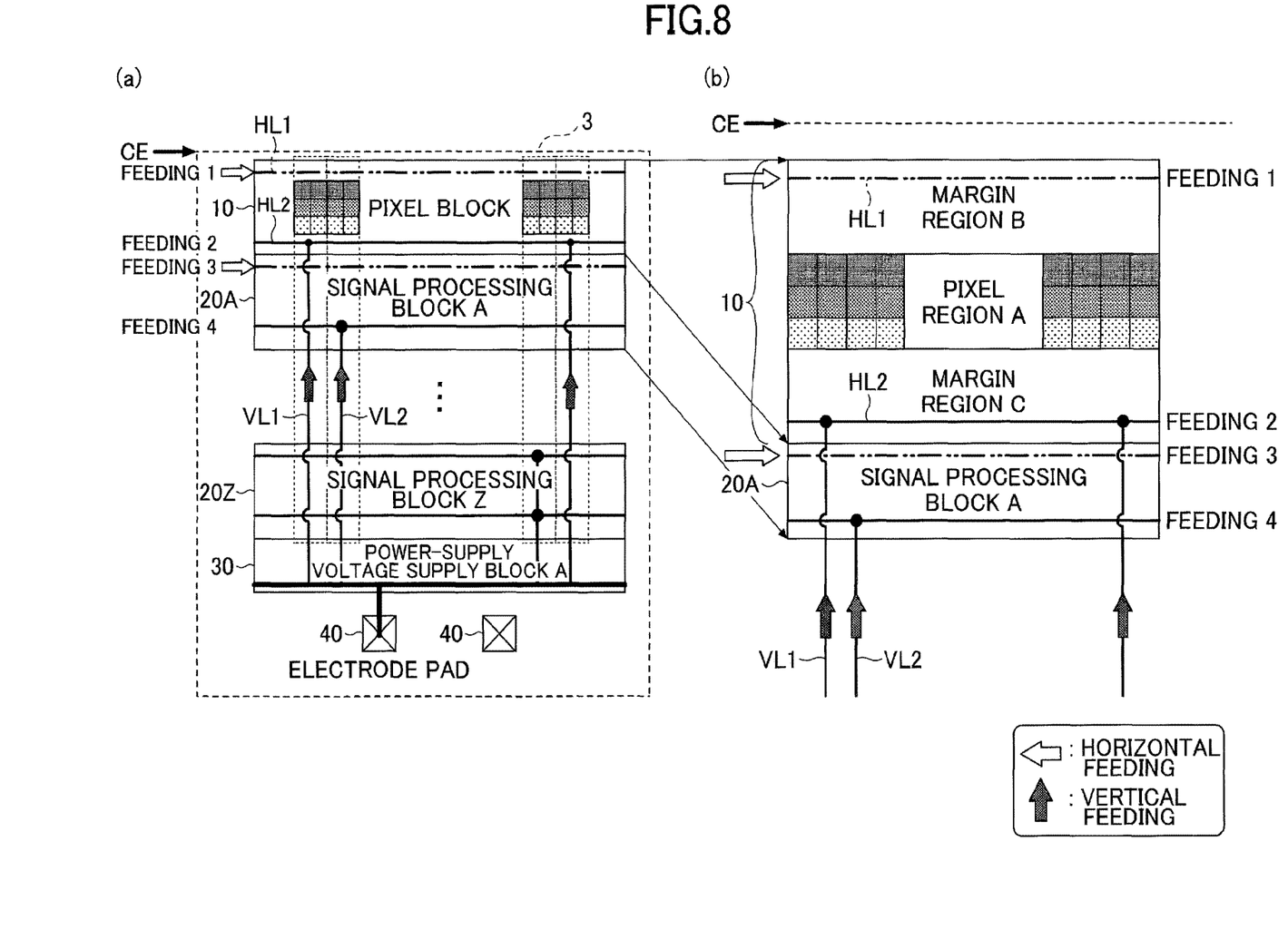
FIG. 8 is a diagram schematically depicting a power feeding method in the pixel blocks.

FIG. 8 is a diagram schematically depicting a power feeding method in the pixel block 10 according to a fifth embodiment.

The photoelectric conversion device according to the embodiment is presupposed to be mounted on one chip. In the case of being mounted on one chip, when a distance between a chip edge (CE) and a pixel is short, as illustrated in a part (a) of FIG. 8, a photoelectric conversion element PD in the pixel 11 may be affected by a stress, and an image characteristic may be degraded.

Thus, as illustrated in a part (b) of FIG. 8, in the pixel block 10, above the pixel region A including the pixel 11 provided with the photoelectric conversion element PD, as illustrated in FIG. 3, a margin region B that does not include the pixel 11 may be arranged, and thereby the pixel region A may be separated from the chip edge CE.

At this time, when a power source voltage is supplied from the power source voltage supply block 30 to the margin region B with the vertical power feeding, the vertical power feeding signal traverses the pixel 11, an opening of a pixel becomes narrower, and sensitivity may be degraded.

Thus, it is effective to separate the power feeding methods such that the horizontal power feeding is used for a block (margin region B) arranged above the pixel region A including the pixel 11 (power feeding 1 using HL1), and the vertical power feeding is used for a block (margin region C) below the pixel (power feeding 2 using VL1 (using the wiring HL2)).

That is, in the pixel block 10, the vertical power feeding is performed using the vertical power feeding wiring VL1, for a part that is closer to the power source voltage supply block 30 than at least the plurality of pixels 11, and a part that is farther from the power source voltage supply block 30 than at least the plurality of pixels 11 is fed power using the horizontal power feeding wiring HL1.

According to the aforementioned setting, a signal going through the vertical power feeding wiring VL1 does not traverse the pixel. Thus, the opening of the pixel is ensured, and a photoelectric sensitivity can be ensured.

Sixth Embodiment

Figure 9:
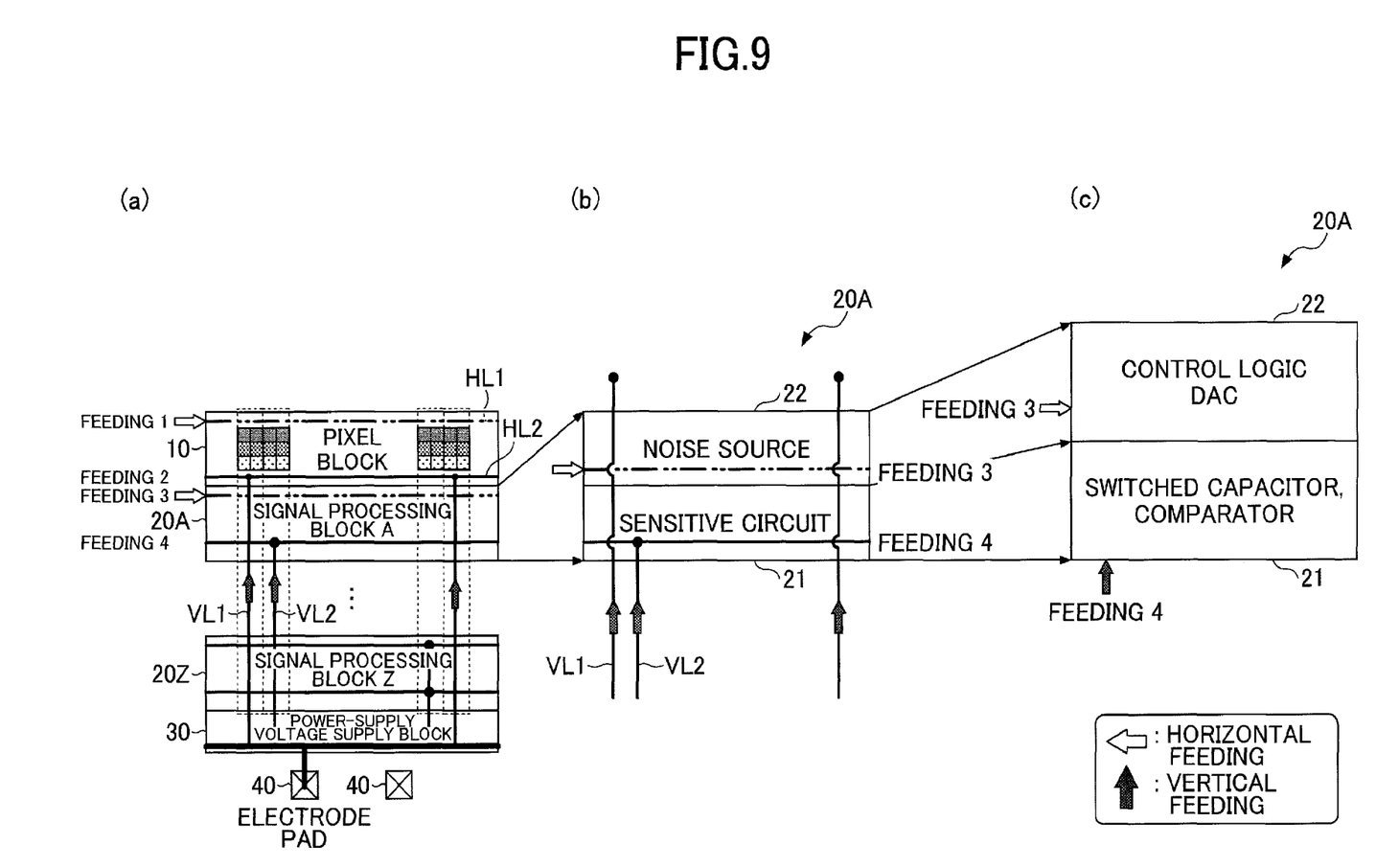
FIG. 9 is a diagram schematically depicting the power feeding method in a case of using only a horizontal power feeding for a noise source.

FIG. 9 is a diagram schematically depicting a power feeding method in the case of using only the horizontal power feeding for a noise source. In FIG. 9, a part (a) illustrates a photoelectric conversion device, a part (b) is an enlarged diagram illustrating a signal processing block A, and a part (c) illustrates an example of a signal processing block configured of a cyclic-type A/D converter.

In the fundamental configuration of the present invention, illustrated in FIG. 1, according to the vertical power feeding, the power source voltage from the power source voltage supply block 30 is fed both to the signal processing blocks 20A to 20Z and to the pixel block 10, via the common vertical power feeding wiring VL.

However, in the embodiment, in the case where a sensitive circuit 21 and a noise source 22 are separated from each other, in the signal processing block 20A, the noise source is set to be subjected to only the horizontal power feeding. That is, for the noise source of the signal processing blocks 20A to 20Z, the vertical power feeding is not performed.

Specifically, as an example illustrated in the part (a) and the part (b), in the signal processing block 20A, a power feeding 3 using the horizontal power feeding wiring HL3 is used for the noise source 22, and a power feeding 4 using the vertical power feeding wiring VL2 is used for a sensitive circuit 21, that is susceptible to the noise.

Figure 10:
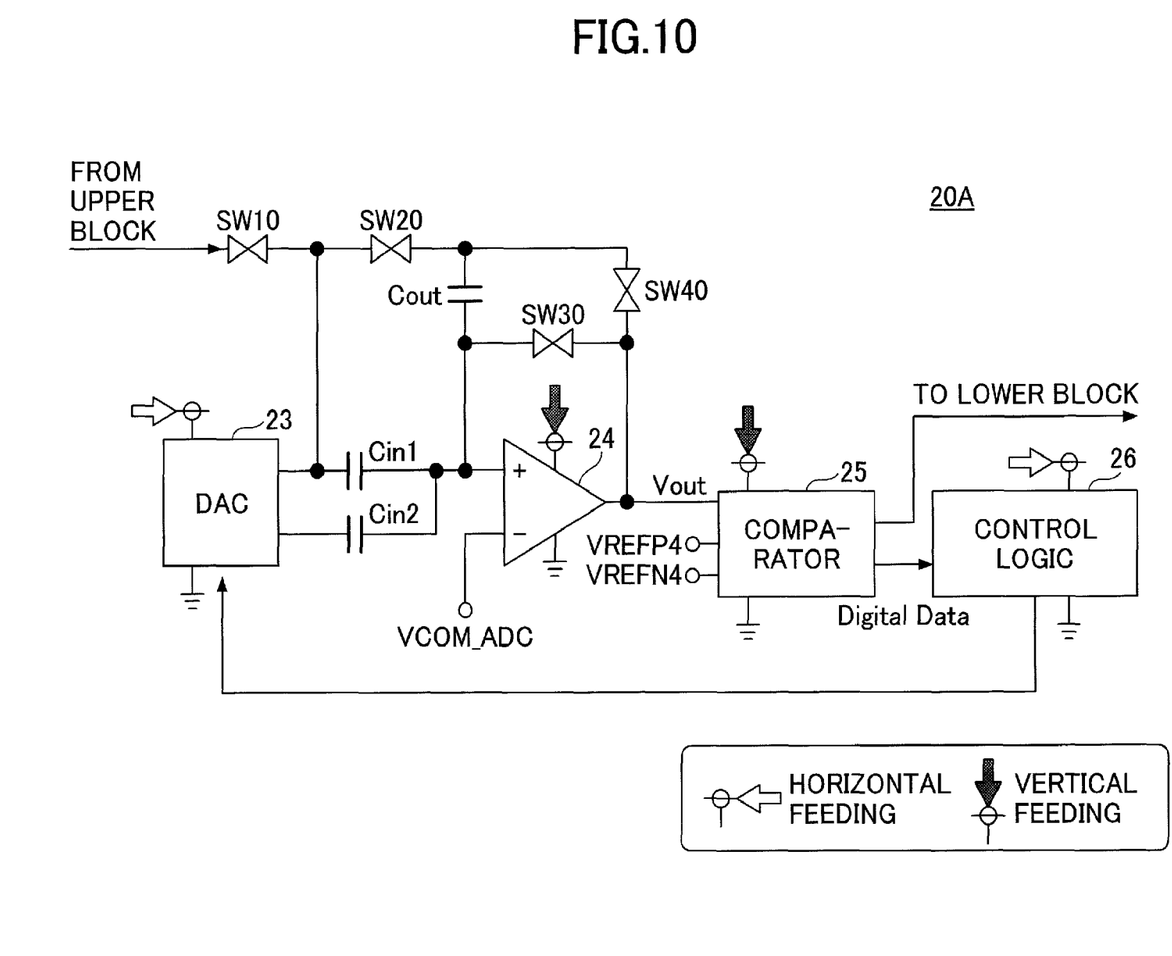
FIG. 10 is a diagram schematically depicting a circuit in a case where a signal processing block is a cyclic type A/D converter.

The power feeding method will be described in detail using a specific example. FIG. 10 is a diagram schematically depicting a circuit in a case where the signal processing block is a cyclic type A/D converter.

In the case where the signal processing block 20A is a cyclic type A/D converter (ADC), a control logic 26 or a D/A converter (DAC) 23 falls under the noise source 22, and capacitors Cin1, Cin2, and Cout, switches SW10 to SW40, an amplifier 24, or a comparator 25 are fall within the sensitive circuit 21. Note that the capacitors Cin1, Cin2, and Cout, the switches SW10 to SW40, and amplifier 24 function as switched capacitors.

The circuit is a typical cyclic A/D converter. For example, the circuit performs sampling and holding, for an an input signal, input to the switch SW10, from a block that is arranged at an upper stage by one, with the switches SW10 to SW40, and repeatedly performs comparison and amplification, and thereby performs conversion for an electric voltage, and outputs digital data to a lower stage.

In the circuit, the vertical power feeding (power feeding 4) is used for feeding power to the amplifier 24 and the comparator 25 in the switched capacitor, that are elements with high sensitivities.

In contrast, in the DAC 23 or the control logic 26, because a signal level amplifies from the GND to the power source voltage, when a signal is transmitted, the signal is liable to include noise, and the DAC 23 or the control logic 26 becomes a noise source. Thus, the horizontal power feeding HL (power feeding 3) is used so that the power feeding is separated from a power feeding to other elements with high sensitivities.

In the aforementioned description, the vertical power feeding is used in order to reduce the wiring resistance. However, with the same method, in addition to the power source voltage, a reference voltage or the like used for a clock or an amplifier can be supplied using the vertical wiring.

As described above, based on the respective embodiments, the present invention has been described. However, the present invention is not limited to the requirements illustrated in the embodiments. Regarding this point, various variations and modifications may be made without departing from the scope of the present invention, and can be properly determined in accordance with an application form.

REFERENCE SIGNS LIST 1 photoelectric conversion device
10 pixel block
20 signal processing block
30 power source voltage supply block
40, 40A, 40B electrode pad
PU1, PU2, PUx, Pun column
RE, RO red pixel unit
GE, GO green pixel unit
BE, BO blue pixel unit
11 pixel
PD photoelectric conversion element
SW1 reset switch, reset transistor
SW2 transfer switch, transfer transistor
AMP1 first amplifier, first amplifier transistor
FD float diffusion region (electric charge/voltage conversion unit)
12 analog memory
SW3 memory writing selection switch, memory writing selection transistor
SW4, SW5 capacitance selection switch, capacitance selection transistor
SW6 pixel selection switch, pixel selection transistor C1, C2 capacitor (capacitance), transistor capacitance
13 first electric current source
14 second electric current source
15 second amplifier, second amplifier transistor
16 column signal processing unit
Vrd reset voltage, reset train voltage
Vm memory reference voltage
A pixel region
B, C margin region
20 A cyclic A/D converter
21 sensitive circuit
22 noise source
23 D/A converter (DAC)
25 control logic
HL horizontal power feeding wiring
VL (VL1 to VLn) vertical power feeding wiring
VLx(p) vertical power feeding wiring for pixel block
VLx(s) vertical power feeding wiring for signal processing blocks

What is claimed is:

1. A photoelectric conversion device, having a horizontally long rectangular shape, comprising:
   a pixel block in which a plurality of pixels are arranged;
   a plurality of signal processing blocks, arranged in parallel along a transverse direction of the photoelectric conversion device, configured to process a signal output from the pixel block;
   a power source voltage supply block configured to supply a power source voltage to the pixel block and the plurality of signal processing blocks; and
   an electrode pad connected to the power source voltage supply block,
   wherein each of the plurality of pixels includes a photoelectric conversion element configured to perform a photoelectric conversion in accordance with an incident light, and an electric charge/voltage conversion unit, including a first amplifier, configured to convert an electric charge, converted from the incident light, into an electric voltage,
   wherein in the pixel block, a plurality of columns are arranged in parallel along a longitudinal direction of the photoelectric conversion device, each column being set as a unit of signal processing including a predetermined number of pixels, as a whole entity,
   wherein a plurality of vertical power feeding wirings that enable the power source voltage, output from the power source voltage supply block, to be fed to each of the plurality of columns of the pixel block, from the transverse direction, are arranged,
   wherein a plurality of horizontal power feeding wirings that enable the power source voltage, output from the power source voltage supply block, to be fed to the pixel block and the plurality of signal processing blocks, from the longitudinal direction, are arranged, and
   wherein the plurality of vertical power feeding wirings and the plurality of horizontal power feeding wirings are connected to each other.

2. The photoelectric conversion device according to claim 1,
   wherein the pixel block and each block of the plurality of signal processing blocks is fed power via different vertical power feeding wiring for each column.

3. The photoelectric conversion device according to claim 2,
   wherein when a wiring resistance of the vertical power feeding wiring from the pixel block to the power source voltage supply block is Y ($\Omega$), and a wiring resistance of the vertical power feeding wiring from a signal processing block, from among the plurality of signal processing blocks arranged in parallel along the transverse direction, that is arranged at a position closest to the pixel block, to the power source voltage supply block is Z ($\Omega$), the wiring resistances are set so as to satisfy a relation "Z+Y>10*(Y−Z)".

4. The photoelectric conversion device according to claim 2,
   wherein when a wiring resistance of the vertical power feeding wiring from the pixel block to the power source voltage supply block is Y ($\Omega$), and a wiring resistance of the vertical power feeding wiring from a signal processing block, from among the plurality of signal processing blocks arranged in parallel along the transverse direction, that is arranged at a position closest to the pixel block, to the power source voltage supply block is Z ($\Omega$), the wiring resistances are set so as to satisfy a relation "Z+Y>100*(Y−Z)".

5. The photoelectric conversion device according to claim 1,
   wherein in a case where an element is arranged at a location farther from the power source voltage supply block than the plurality of pixels,
   in the pixel block, a part, which is closer to the power source voltage supply block than at least the plurality of pixels, is fed power using the vertical power feeding wiring, and a part, which is farther from the power source voltage supply block than at least the plurality of pixels, is fed power using the horizontal power feeding wiring.

6. The photoelectric conversion device according to claim 5,
   wherein in each of the columns, analog memories are connected to corresponding pixels of the plurality of pixels,
   wherein the plurality of analog memories are connected to an electric current source that is common to the analog memories, and connected to a second amplifier that is common to the analog memories, and
   wherein a power feeding to the first amplifier in each of the plurality of pixels, grounding to the photoelectric conversion element, a power feeding to the electric current source, and a power feeding to the second amplifier are performed using the horizontal power feeding wirings.

7. The photoelectric conversion device according to claim 1,
   wherein at least one signal processing block of the plurality of signal processing blocks is a cyclic type analog/digital converter, and
   wherein in the cyclic type analog/digital converter, a digital/analog converter and a control logic are fed power via the horizontal power feeding wirings, and other elements are fed power via the vertical power feeding wirings.

8. The photoelectric conversion device according to claim 1,
   wherein a bypass capacitor is arranged in the power source voltage supply block so as to connect a power source line and a ground.

* * * * *